(12) United States Patent
Osawa (10) Patent No.: US 6,501,129 B2
(45) Date of Patent: Dec. 31, 2002

(54) SEMICONDUCTOR DEVICE (75) Inventor: Akihiko Osawa, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/820,369

(22) Filed: Mar. 29, 2001

(65) Prior Publication Data
US 2001/0025984 A1 Oct. 4, 2001

(30) Foreign Application Priority Data
Mar. 30, 2000 (JP) ........................................ 2000-093461

(51) Int. Cl.[7] .................... H01L 29/76; H01L 29/94; H01L 31/062; H01L 31/113; H01L 31/119
(52) U.S. Cl. .................... 257/330; 257/339; 257/332; 257/302; 438/259; 438/270
(58) Field of Search ................... 257/339, 327, 257/328, 329, 330, 331, 332, 334, 133, 302, 270, 500, 502, 493, 471

(56) References Cited

U.S. PATENT DOCUMENTS

| | | | | |
|---|---|---|---|---|
| 5,021,845 A | * | 6/1991 | Hashimoto | 257/23 |
| 5,045,904 A | * | 9/1991 | Kobayashi et al. | 257/23 |
| 5,321,289 A | * | 6/1994 | Baba et al. | 257/331 |
| 5,719,409 A | | 2/1998 | Singh et al. | |
| 5,864,159 A | * | 1/1999 | Takahashi et al. | 257/330 |
| 5,895,951 A | * | 4/1999 | So et al. | 257/330 |
| 6,043,125 A | * | 3/2000 | Williams et al. | 438/270 |
| 6,084,264 A | * | 7/2000 | Darwish | 257/329 |
| 6,211,549 B1 | * | 4/2001 | Funaki et al. | 257/329 |
| 6,252,258 B1 | * | 6/2001 | Chang et al. | 257/133 |
| 6,252,288 B1 | * | 6/2001 | Chang | 257/471 |
| 6,307,246 B1 | * | 10/2001 | Nitta et al. | 257/493 |

* cited by examiner

Primary Examiner—David Nelms
Assistant Examiner—Andy Huynh
(74) Attorney, Agent, or Firm—Oblon, Spivak, McClellland, Maier & Neustadt, P.C.

(57) ABSTRACT

Formed in a part of the base region is an impurity diffusion region extending in a vertical direction and having an impurity concentration lower than that in the other portion of the base region. By the formation of the impurity diffusion region, the depletion layer is extended toward the base region so as to improve the breakdown voltage. The impurity diffusion region is formed by forming a trench in a part of the base region, a conductive film being buried in the trench, followed by introducing by ion implantation an impurity of the conductivity type equal to that in the base region into the side wall and the bottom of the trench in a concentration lower than that in the base region and subsequently diffusing the implanted impurity ions. The impurity diffusion region thus formed permits relaxing the electric field concentration on the corner portion of the gate trench and on the extended portion of the base region so as to improve the breakdown voltage.

10 Claims, 5 Drawing Sheets

SEMICONDUCTOR DEVICE

CROSS-REFERENCE TO RELATED APPLICATIONS

This application is based upon and claims the benefit of priority from the prior Japanese Patent Application No. 2000-093461, filed Mar. 30, 2000, the entire contents of which are incorporated herein by reference.

BACKGROUND OF THE INVENTION

The present invention relates to a semiconductor device and a method of manufacturing the same, particularly, to a semiconductor device having a high breakdown voltage and a method of manufacturing the particular semiconductor device.

Figure 7:
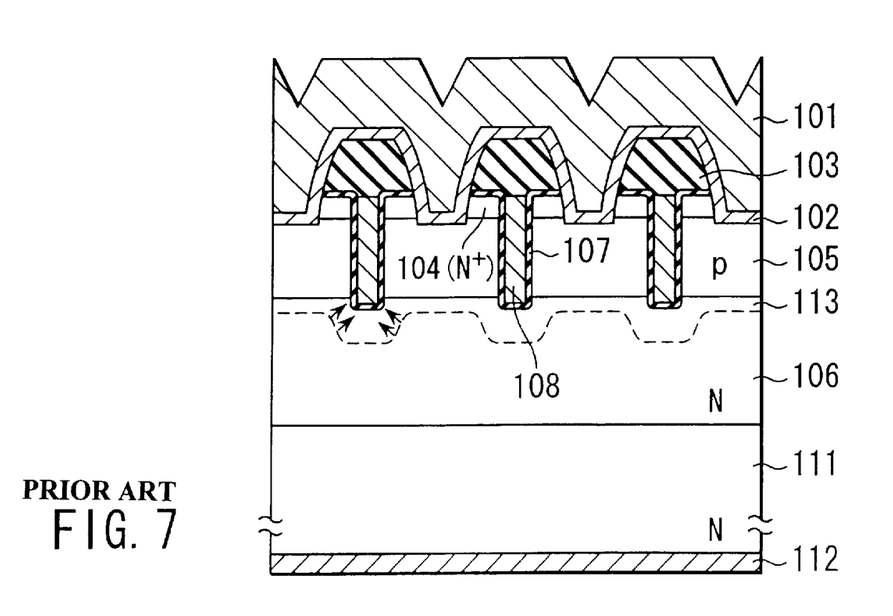
FIG. 7 is a cross sectional view showing a conventional semiconductor device.

FIG. 7 is a cross sectional view showing a conventional power (high breakdown voltage) vertical type MOSFET having a trench gate structure. A trench gate structure that permits improving the channel density is widely employed in a power vertical MOSFET in order to improve the on-voltage characteristics. As shown in FIG. 7, an N-type epitaxial semiconductor layer is formed on a first main surface (upper surface) of an N-type silicon semiconductor substrate 111. Formed in the N-type epitaxial semiconductor layer are an N-type drain region (N$^-$-type drain region) 106, a P-type base region 105, and an N-type source region (N$^+$-type source region) 104. The P-type base region 105 is formed in a surface region of the N-type drain region 106. The N-type source region 104 is formed in a surface region of the P-type base region 105. Each of the P-type base region 105 and the N-type source region 104 is formed by an impurity diffusion. A gate trench is formed in a manner to extend from the surface of the N-type source region 104 through the N-type source region 104 and the P-type base region 105 so as to reach the N-type drain region 106. A gate insulating film 107 consisting of, for example, a silicon oxide film is formed on the side wall and the bottom of the gate trench. A gate electrode 108 made of, for example, a polycrystalline silicon (polysilicon) is buried in the gate trench. The gate insulating film 107 and the gate electrode 108 are covered with an interlayer insulating film 103 consisting of, for example, a silicon oxide film. A barrier metal layer 102 is formed on the entire substrate surface including the interlayer insulating film 103. A source electrode 101 consisting of a metal electrode such as aluminum is formed on the source region 104 and the base region 105 with the barrier metal layer 102 interposed therebetween, and the source region 104 and the base region 105 are electrically connected to each other. A drain electrode 112, which is a metal electrode, is formed on a second main surface (back surface) of the semiconductor substrate 111. FIG. 7 shows a unit cell portion of a semiconductor device, which corresponds to a unit cell portion of a semiconductor device in FIG. 9, as represented by region A in FIG. 9. Incidentally, the semiconductor device shown in FIG. 9 is for the exemplifying purpose. Therefore, the construction shown in FIG. 7 is not necessarily equal to the construction of the unit cell portion of the semiconductor device shown in FIG. 9. Similarly, FIG. 8 shows a unit cell portion of another conventional semiconductor device.

In the conventional power vertical MOSFET having a trench gate structure as shown in FIG. 7, the impurity concentration is increased in the epitaxial silicon semiconductor layer 106 formed on the silicon semiconductor substrate 111 in order to lower the on-voltage. A depletion layer is generated if a reversed bias is applied between the source electrode and the drain electrode. If the impurity concentration in the epitaxial silicon semiconductor layer 106 is increased, a depletion layer 113 is generated as shown in the drawing. As denoted by arrows in the drawing, the electric field is concentrated in the corner portion of the trench because of the presence of the depletion layer. It should be noted that the Vdss breakdown voltage is deteriorated by the electric field concentration occurring in the corner portion of the trench.

Figure 8:
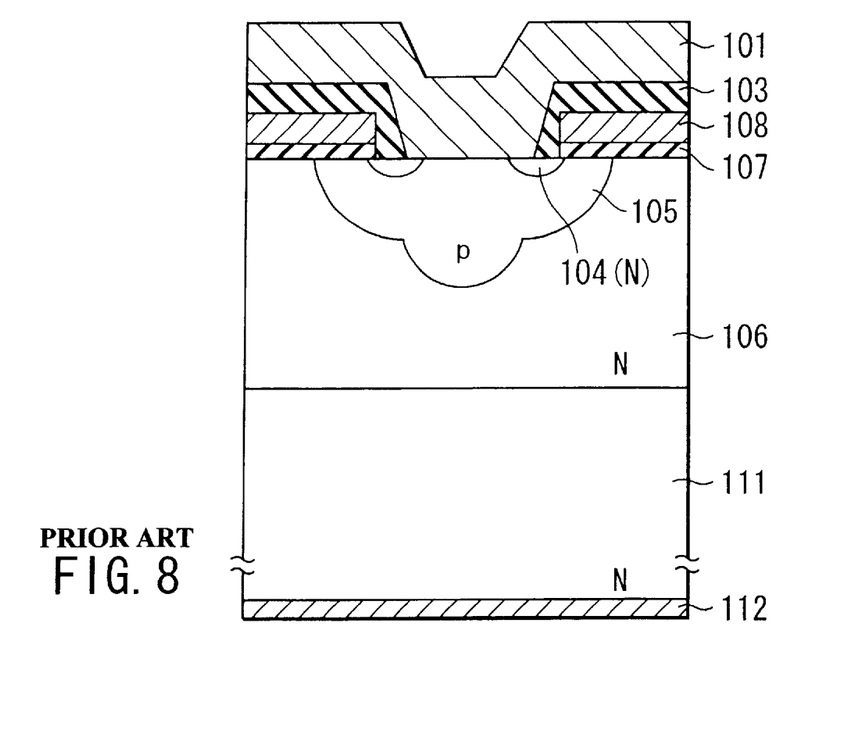
FIG. 8 is a cross sectional view showing another conventional semiconductor device.
Figure 9:
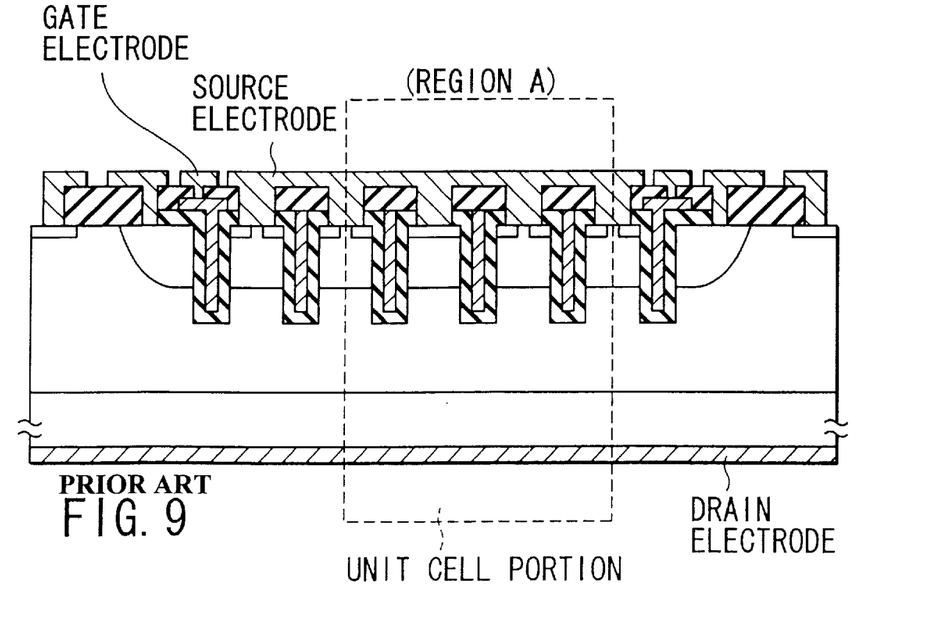
FIG. 9 is a cross sectional view showing the entire image of the conventional semiconductor device.

FIG. 8 is a cross sectional view showing a conventional power MOSFET of a planar structure. As shown in the drawing, an N-type epitaxial semiconductor layer (N-type drain region) 106 is formed on a first main surface (upper surface) of an N-type silicon semiconductor substrate 111. A P-type base layer 105 is formed in a surface region of the N-type drain region 106. Also, an N-type source region 104 is formed in a surface region of the P-type base region 105. A gate insulating film 107 such as a silicon oxide film is formed on the N-type source region 104, the P-type base region 105 and the N-type drain region 106 except the region where a source electrode is to be formed. Also, a gate electrode 108 made of, for example, polysilicon is formed on the gate insulating film 107. The gate insulating film 107 and the gate electrode 108 are covered with an interlayer insulating film 103 such as a silicon oxide film. A source electrode 101, which is a metal electrode made of, for example, aluminum, is formed on the N-type source region 104 and the P-type base region 105 so as to electrically connect the N-type source region 104 to the P-type base region 105. Further, a drain electrode 112 is formed on a second main surface (back surface) of the semiconductor substrate 111.

In the conventional power MOSFET of the planar structure shown in FIG. 8, the impurity concentration is also increased in the epitaxial silicon semiconductor layer 106 formed on the silicon semiconductor substrate 111 in order to lower the on-voltage, as in the power vertical MOSFET of the trench gate structure shown in FIG. 7. A depletion layer is generated when a reverse bias is applied between the source electrode and the drain electrode. If the impurity concentration is increased in the epitaxial silicon semiconductor layer 106, the electric field is concentrated in the extending portion of the P-type base region 105. It should be noted that the Vdss breakdown voltage is deteriorated by the electric field concentration taking place in the extending portion of the P-type base region 105.

BRIEF SUMMARY OF THE INVENTION

An object of the present invention, which has been achieved in view of the situation described above, is to provide a semiconductor device in which the electric field concentration is relaxed in the corner portion of the trench gate or in the extending portion of the base region so as to improve the breakdown voltage and a method manufacturing the particular semiconductor device.

The present invention is featured in that formed in a part of the base region is an impurity diffusion region extending in a vertical direction of the semiconductor substrate and having an impurity concentration lower than that in the other portion of the base region. The impurity concentration of the impurity diffusion region is an average value of the concentration of the impurities diffused in the base region excluding the extending region. By forming the impurity diffusion region of a low impurity concentration, it is possible to extend the depletion layer toward the base region so as to improve the breakdown voltage. In the present invention, a trench is formed in a part of the base region, and an impurity of the conductivity type equal to that of the base region is introduced into the side wall and the bottom portion of the trench by ion implantation in a concentration lower than that in the base region, followed by diffusing the implanted impurity so as to form the impurity diffusion region of the low impurity concentration.

According to a first aspect of the present invention, there is provided a semiconductor device, comprising: a semiconductor substrate; a semiconductor layer of a first conductivity type formed on one main surface region of the semiconductor substrate; a drain region of the first conductivity type formed in the semiconductor layer of the first conductivity type; a base region of a second conductivity type formed in a surface region of the drain region; a source region of the first conductivity type formed in a surface region of the base region; a trench having a conductive layer and/or an insulating layer buried therein and extending from the surface of the base region through the base region to reach an inner region of the drain region; an impurity diffusion region of the second conductivity type formed in the periphery of the side wall of that portion of the trench which is positioned within the drain region and having an impurity concentration lower than that in the base region; a gate insulating film formed to cover a part of the surfaces of the drain region, the base region and the source region; and a gate electrode formed on the gate insulating film.

In the semiconductor device according to the first aspect of the present invention, the semiconductor substrate may be of the first conductivity type.

In the semiconductor device according to the first aspect of the present invention, the semiconductor substrate may be of the second conductivity type.

According to a second aspect of the present invention, there is provided a semiconductor device, comprising: a semiconductor substrate; a semiconductor layer of a first conductivity type formed on one main surface region of the semiconductor substrate; a drain region of the first conductivity type formed in the semiconductor layer of the first conductivity type; a base region of a second conductivity type formed in a surface region of the drain region; a source region of the first conductivity type formed in a surface region of the base region; a first trench having a conductive layer and/or an insulating layer buried therein and extending from the surface of the base region through the base region to reach an inner region of the drain region; an impurity diffusion region of the second conductivity type formed in the periphery of the side wall of that portion of the first trench which is positioned within the drain region and having an impurity concentration lower than that in the base region; a second trench extending from the surface of the source region or from the surface of that portion of the base region which is contiguous to the source region to reach an inner region of the drain region; a gate insulating film formed in the side wall and the bottom region of the second trench; and a gate electrode buried in the second trench in a manner to cover the gate insulating film.

In the semiconductor device according to the second aspect of the present invention, the semiconductor substrate may be of the first conductivity type.

In the semiconductor device according to the second aspect of the present invention, the semiconductor substrate may be of the second conductivity type.

In the semiconductor device according to the second aspect of the present invention, the depth of the first trench from the surface of the base region may be larger than that of the second trench from the surface of the source region or from the surface of that portion of the base region which is contiguous to the source region.

In the semiconductor device according to the second aspect of the present invention, in which the first trench is deeper than the second trench, the semiconductor substrate may be of the first conductivity type.

In the semiconductor device according to the second aspect of the present invention, in which the first trench is deeper than the second trench, the semiconductor substrate may be of the second conductivity type.

In the semiconductor device according to the second aspect of the present invention, in which the first trench is deeper than the second trench and the semiconductor substrate is of the second conductivity type, a buffer layer formed of a semiconductor layer of the first conductivity type having an impurity concentration higher than that in the semiconductor layer of the first conductivity type may be formed between the semiconductor substrate and the semiconductor layer of the first conductivity type.

According to a third aspect of the present invention, there is provided a method of manufacturing a semiconductor device, comprising the steps of: forming a semiconductor layer of a first conductivity type on one main surface of a semiconductor substrate; forming a base region of a second conductivity type in a surface region of a drain region of the first conductivity type formed in the semiconductor layer of the first conductivity type; forming a source region of the first conductivity type in a surface region of the base region; forming a trench extending from the surface of the base region through the base region to reach an inner region of the drain region; forming an impurity diffusion region of the second conductivity type having an impurity concentration lower than that in the base region in the periphery of the side wall of that portion of the trench which is positioned within the drain region; burying a conductive layer and/or an insulating layer within the trench; forming a gate insulating film in a manner to cover a part of the surfaces of the drain region, the base region and the source region; and forming a gate electrode on the gate insulating film.

In the method of manufacturing a semiconductor device according to the third aspect of the present invention, the impurity diffusion region of the second conductivity type may be formed by implanting ions of the impurity of the second conductivity type.

According to a fourth aspect of the present invention, there is provided a method of manufacturing a semiconductor device, comprising the steps of: forming a semiconductor layer of a first conductivity type on one main surface of a semiconductor substrate; forming a base region of a second conductivity type in a surface region of the drain region of the first conductivity type formed in the semiconductor layer of the first conductivity type; forming a source region of the first conductivity type in a surface of the base region; forming a first trench extending from the surface of the base region through the base region to reach an inner region of the drain region; forming an impurity diffusion region of the second conductivity type having an impurity concentration lower than that in the base region in the periphery of the side wall of that portion of the first trench which is positioned within the drain region; burying a conductive layer and/or an insulating layer within the first trench; forming a second trench extending from the surface of the source region or from the surface of that portion of the base region which is contiguous to the source region to reach an inner region of the drain region; forming a gate insulating film on the side wall and the bottom surface of the second trench; and forming a gate electrode within the second trench in a manner to cover the gate insulating film.

In the method of manufacturing a semiconductor device according to the fourth aspect of the present invention, the depth of the first trench from the surface of the base region may be larger than that of the second trench from the surface of the source region or from the surface of that portion of the base region which is contiguous to the source region.

Further, in the method of manufacturing a semiconductor device according to the fourth aspect of the present invention, the impurity diffusion region of the second conductivity type may be formed by ion implantation of an impurity of the second conductivity type.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will now be described with reference to the accompanying drawings.

Figure 1:
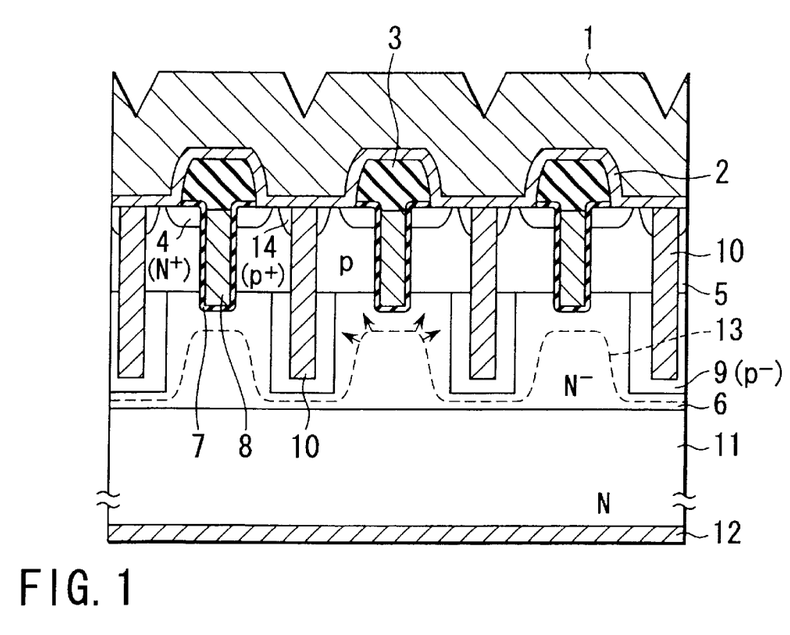
FIG. 1 is a cross sectional view showing a power vertical MOSFET of a trench gate structure according to a first embodiment of the present invention.
Figure 2:
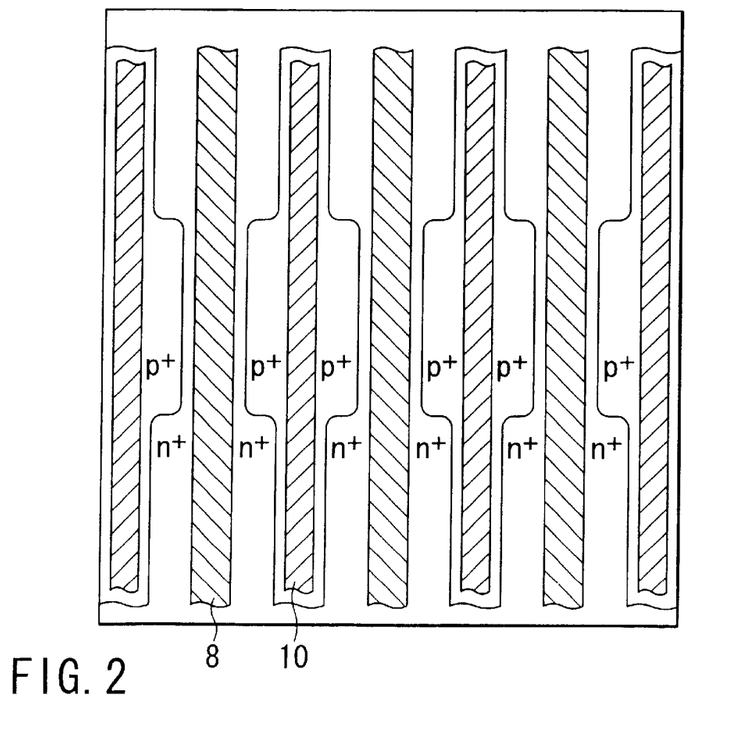
FIG. 2 is a plan view showing a gate pattern on the upper surface of the MOSFET shown in FIG. 1 and a polysilicon pattern within the trench, and showing particularly the relationship between these gate pattern and the polysilicon pattern.

First of all, FIGS. 1 and 2 collectively show a power (high breakdown voltage) vertical MOSFET of a trench gate structure according to a first embodiment of the present invention, wherein FIG. 1 is a cross sectional view of a power (high breakdown voltage) vertical MOSFET of a trench gate structure according to the first embodiment of the present invention, and FIG. 2 is a plan view showing a gate pattern on the upper surface of the MOSFET shown in FIG. 1 and a polysilicon pattern within the trench, and showing particularly the relationship between these gate pattern and the polysilicon pattern. In other words, FIGS. 1 and 2 show a unit cell portion of a semiconductor device.

As shown in FIG. 1, a trench gate structure that permits improving the gate density is employed in the power vertical MOSFET in order to improve the on-voltage characteristics. An N-type epitaxial semiconductor layer is formed on a first main surface (upper surface) of an N-type silicon semiconductor substrate 11. Formed in the N-type epitaxial semiconductor layer are an N-type drain region ($N^-$-type drain region) 6, a P-type base region 5, and an N-type source region ($N^+$-type source region) 4. The P-type base region 5 is formed in a surface region of the N-type drain region 6. The N-type source region 4 is formed in a surface region of the P-type base region 5. Each of the P-type base region 5 and the N-type source region 4 is formed by an impurity diffusion. A gate trench is formed in a manner to extend downward from the surface of the N-type source region 4 through the N-type source region 4 and the P-type base region 5 to reach an inner region of the N-type drain region 6, and a gate insulating film 7 such as a silicon oxide film is formed on the side wall and the bottom of the trench gate. A gate electrode 8 made of, for example, polysilicon is buried in the trench. The gate insulating film 7 and the gate electrode 8 are covered with an interlayer insulating film 3 such as a silicon oxide film. A barrier metal layer 2 is formed on the entire substrate surface including the interlayer insulating film 3. Further, a source electrode 1 consisting of a metal electrode such as an aluminum electrode is formed on the source region 4 and the base region 5 with the barrier metal layer 2 interposed therebetween so as to be connected to the source region 4 and the base region 5. Still further, a drain electrode 12, which is a metal electrode, is formed on a second main surface (back surface) of the semiconductor substrate 11.

A P-type contact region ($P^+$-type contact region) 14 consisting of a diffusion region of a high impurity concentration is formed in a surface region of the P-type base region 5. Also formed is a contact trench extending downward from the surface of the P-type base region 5 through the P-type contact region 14 and the P-type base region 5 to reach an inner region of the N-type drain region 6. A P-type impurity diffusion region ($P^-$-type diffusion region) 9 having an impurity concentration lower than that in the P-type base region 5 is formed on the side wall and the bottom of that portion of the contact trench which is positioned within the N-type drain region 6. A conductive film 10 such as a polysilicon film is buried in the contact trench.

In this embodiment, a conductive film of polysilicon is buried in each of the gate trench and the contact trench. However, the conductive film buried in the trench is not limited to the polysilicon film. It is also possible to bury in the trench another conductive material such as amorphous silicon or SIPOS (amorphous SiO), or an insulating film such as a CVD silicon oxide film.

Further, it is possible to form an oxide film such as a silicon oxide film on the side wall and the bottom of the contact trench and to bury a conductive film such as a polysilicon film or an amorphous silicon film within the trench having the oxide film formed therein.

FIG. 1 shows a depletion layer 13 generated when a reverse bias is applied between the source electrode and the drain electrode of the MOSFET of the construction shown in FIG. 1. In the depletion layer, an electric field is dispersed in the corner portion of the trench gate as denoted by arrows. To be more specific, since the P-type impurity diffusion layer 9 having a low impurity concentration, which is formed in the periphery of the side wall of the contact trench, causes the depletion layer to grow in a direction perpendicular to the gate trench during application of the reverse bias, the electric field concentration on the corner portion of the gate trench is relaxed so as to improve the breakdown voltage. By this technology, the breakdown voltage fully comparable with that in the prior art can be obtained even if the impurity concentration is increased in the epitaxial growth layer of silicon, making it possible to lower the resistance of the epitaxial layer, compared with the prior art. It should also be noted that, since a deep extended base region is partially formed in the base region because of the formation of the contact trench, a low resistivity layer of hole is formed. Since the formation of the low resistivity layer facilitates the flow of the hole current in the step of the switching off, the switching time can be shortened.

How to form the impurity diffusion layer 9 of a low impurity concentration will now be described. In the first step, the base region 5 and the source region 4 are formed by an impurity diffusion, followed by forming a contact trench deeper than the gate trench in the base region 5. In other words, formed is a contact trench extending from the surface of the base region 5 through the base region 5 to reach an inner region of the N-type drain region. Then, the material deposited on the side wall of the contact trench is removed, followed by implanting an impurity such as boron by a rotary implantation (implanting angle of 7°) under an accelerating energy of 60 KeV and at a dose of $2E12/cm^2$. Then, the implanted boron ions are diffused at 1100° C. for 30 minutes under an $N_2$ atmosphere, followed by changing the atmosphere to $N_2/O_2$ of 10/1 and carrying out the diffusion at 1100° C. for 2 hours, so as to form the impurity (boron) diffusion region 9 of a low impurity concentration. Then, the oxide film formed inside the contact trench is removed, followed by burying polysilicon within the contact trench. Further, the buried polysilicon is etched back by a CDE (Chemical Dry Etching) process. The subsequent steps are equal to those of the conventional method.

The semiconductor device thus manufactured was found to exhibit an on-resistance of 2.6Ω (where VG=15V and VD=2V), which is about 1/4.6 of 12Ω for the prior art.

Figure 3:
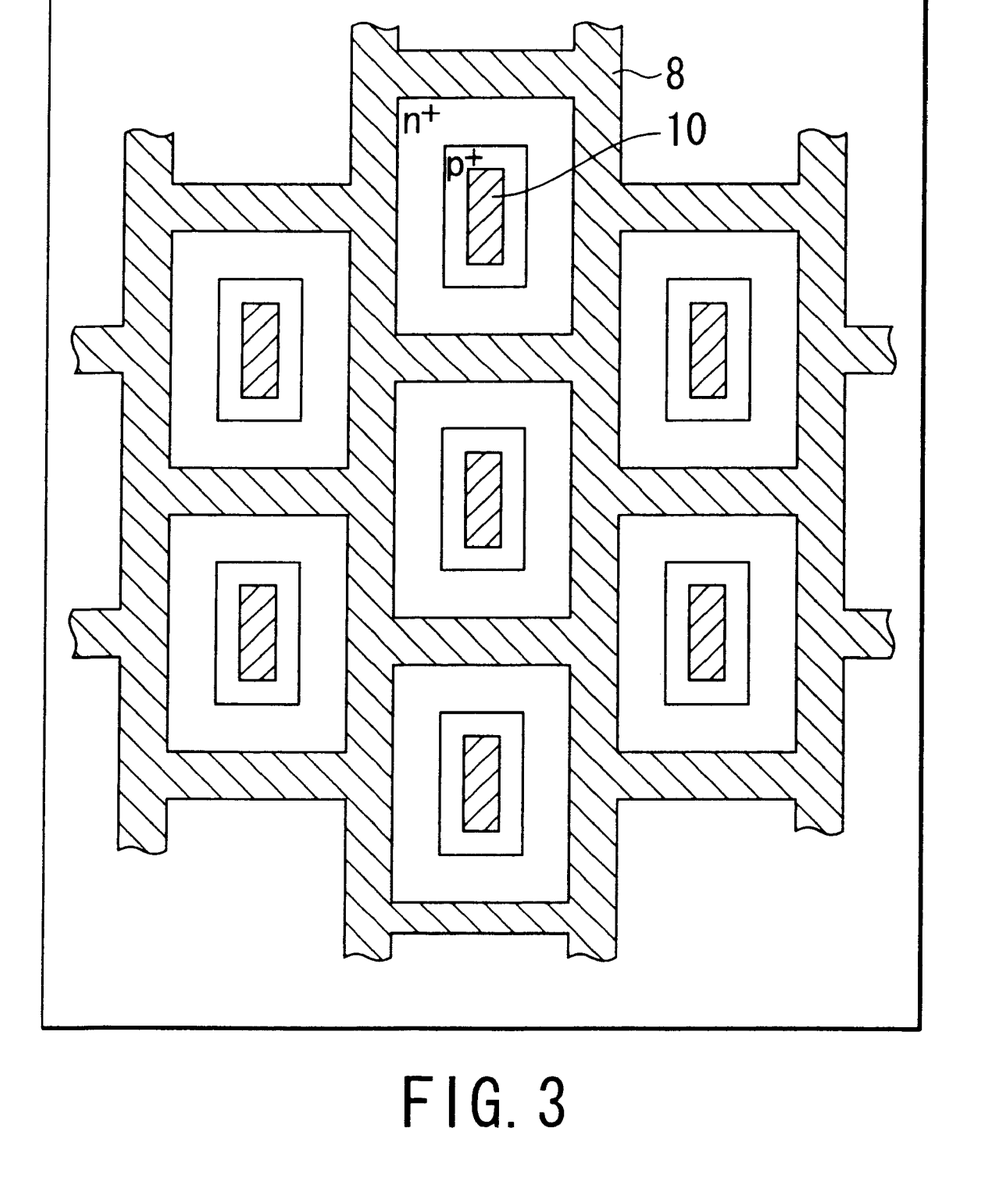
FIG. 3 is a plan view directed to a modification of the first embodiment and showing a gate pattern on the upper surface of a vertical MOSFET and a polysilicon pattern within the trench, and showing particularly the relationship between these gate pattern and the polysilicon pattern.

FIG. 2 shows that the gates are arranged in parallel. Alternatively, it is possible for the gates to be arranged in the shape of a ladder as shown in FIG. 3. FIG. 3 is a plan view directed to a modification of the first embodiment and showing a gate pattern on the upper surface of a vertical MOSFET and a polysilicon pattern within the trench, and showing particularly the relationship between these gate pattern and the polysilicon pattern.

Figure 4:
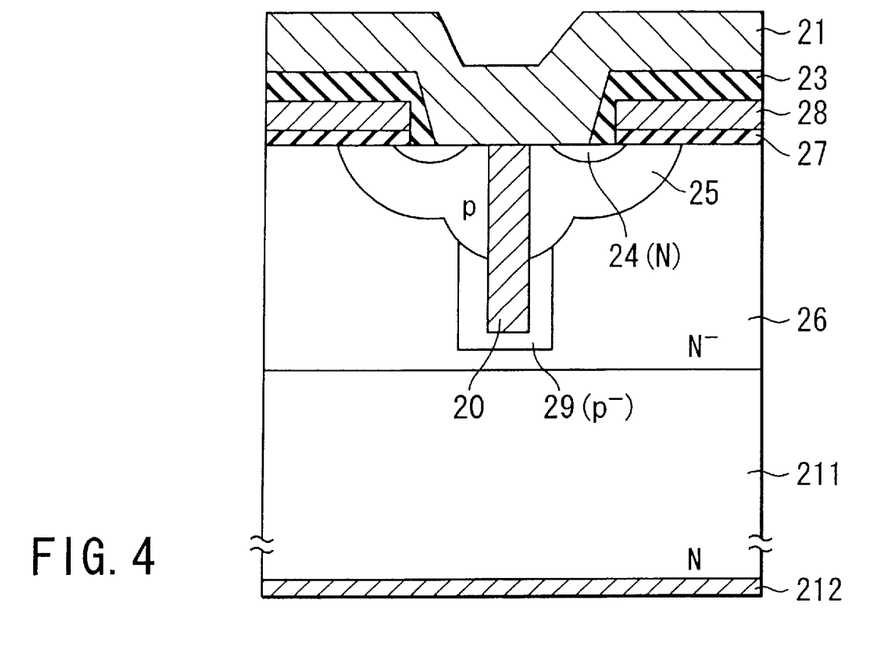
FIG. 4 is a cross sectional view showing a power MOSFET of a planar structure according to a second embodiment of the present invention.

FIG. 4 shows a power MOSFET of a planar structure according to a second embodiment of the present invention.

FIG. 4 is a cross sectional view showing a power MOSFET of a planar structure according to the second embodiment of the present invention. In other words, FIG. 4 shows a unit cell portion of a semiconductor device.

As shown in the drawing, an N-type epitaxial semiconductor layer (N-type drain region) 26 is formed on a first main surface (upper surface) of an N-type silicon semiconductor substrate 211. A P-type base region 25 is formed in a surface region of the N-type drain region 26. Also, an N-type source region 24 is formed in a surface region of the P-type base region 25. A gate insulating film 27 such as a silicon oxide film is formed on the N-type source region 24, the P-type base region 25 and the N-type drain region 26 except the region where a source electrode is to be formed. Also, a gate electrode 28 consisting of, for example, polysilicon is formed on the gate insulating film 27. These gate insulating film 27 and gate electrode 28 are covered with an interlayer insulating film 23 such as a silicon oxide film. A source electrode 21 consisting of a metal electrode such as an aluminum electrode is formed on the N-type source region 24 and the P-type base region 25 so as to be electrically connected to the N-type source region 24 and the P-type base region 25. Further, a drain electrode 212 is formed on a second main surface (back surface) of the semiconductor substrate 211.

Further, formed is a contact trench extending from the surface of the base region 25 through the base region 25 to reach an inner region of the N-type drain region. Still further, a P-type impurity diffusion region (P⁻-type diffusion region) 29 having an impurity concentration lower than that in the P-type base region 25 is formed in the side wall and the bottom of that portion of the contact trench which is positioned within the N-type drain region 26. A conductive film 20 such as a polysilicon film is buried in the contact trench.

In this embodiment, a conductive film of polysilicon is buried in the contact trench. However, the conductive film buried in the trench is not limited to the polysilicon film. It is also possible to bury in the trench another conductive material such as amorphous silicon or SIPOS (amorphous SiO), or an insulating film such as a CVD silicon oxide film.

Further, it is possible to form an oxide film such as a silicon oxide film on the side wall and the bottom of the contact trench and to bury a conductive film such as a polysilicon film or an amorphous silicon film within the trench having the oxide film formed therein.

How to form the impurity diffusion region 29 of a low impurity concentration will now be described. In the first step, the base region 25 and the source region 24 are formed by an impurity diffusion, followed by forming a contact trench deeper than the gate trench in the base region 25. In other words, formed is a contact trench extending from the surface of the base region 25 through the base region 25 to reach an inner region of the N-type drain region. Then, the material deposited on the side wall of the contact trench is removed, followed by implanting an impurity such as boron by a rotary implantation (implanting angle of 7°) under an accelerating energy of 60 KeV and at a dose of $2E12/cm^2$. Then, the implanted boron ions are diffused at 1100° C. for 30 minutes under an $N_2$ atmosphere, followed by changing the atmosphere to $N_2/O_2$ of 10/1 and carrying out the diffusion at 1100° C. for 2 hours, so as to form the impurity (boron) diffusion region 29 of a low impurity concentration. Then, the oxide film formed inside the contact trench is removed, followed by burying polysilicon within the contact trench. Further, the buried polysilicon is etched back by a CDE (Chemical Dry Etching) process. The subsequent steps are equal to those of the conventional method.

In this embodiment, an electric field is dispersed in the extended portion of the P-type base region 25. To be more specific, since the P-type impurity diffusion layer 29 having a low impurity concentration, which is formed in the periphery of the side wall of the contact trench, causes the depletion layer to grow in a direction perpendicular to the gate trench during application of the reverse bias, the electric field concentration on the extended portion of the P-type base region 25 is relaxed so as to improve the breakdown voltage. By this technology, the breakdown voltage fully comparable with that in the prior art can be obtained even if the impurity concentration is increased in the epitaxial growth layer of silicon, making it possible to lower the resistance of the epitaxial layer, compared with the prior art. It should also be noted that, since a deep extended base region is partially formed in the P-type base region 25 because of the formation of the contact trench, a low resistivity layer of hole is formed. Since the formation of the low resistivity layer facilitates the flow of the hole current in the step of the switching off, the switching time can be shortened.

A power (high breakdown voltage) IGBT of a trench gate structure according to a third embodiment of the present invention will now be described with reference to FIG. 5.

Figure 5:
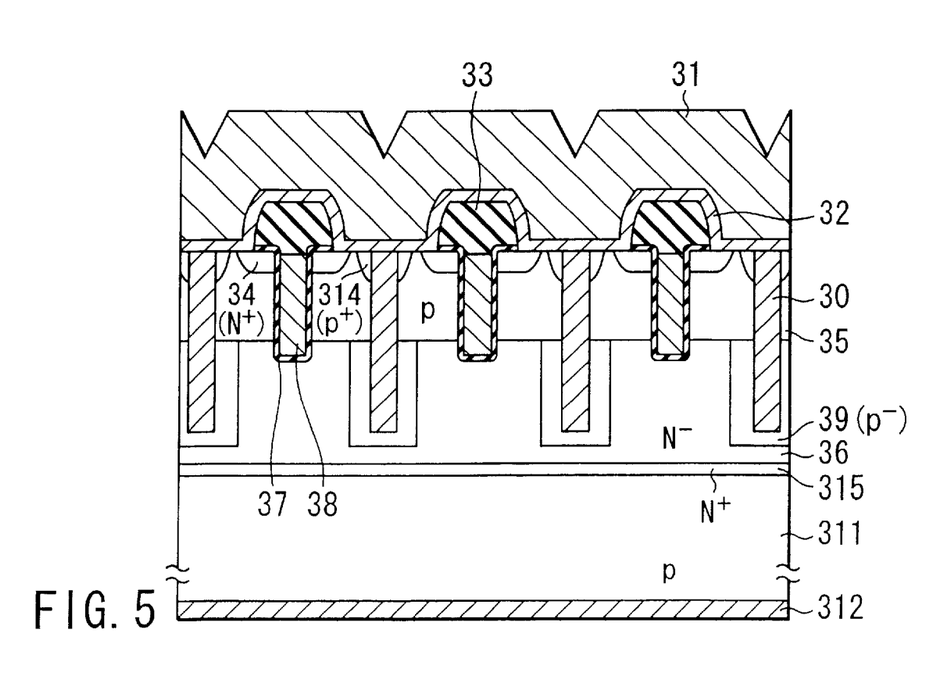
FIG. 5 is a cross sectional view showing a power IGBT of a trench gate structure according to a third embodiment of the present invention.

FIG. 5 is a cross sectional view showing a power IGBT of a trench gate structure according to a third embodiment of the present invention. In other words, FIG. 5 shows a unit cell portion of a semiconductor device.

The power IGBT employs a trench gate structure that permits improving the gate density for improving the on-voltage characteristics. A buffer layer 315 consisting of an N$^+$-type epitaxial silicon semiconductor layer is formed on a first main surface (upper surface) of a P-type silicon semiconductor substrate 311, and an N-type epitaxial semiconductor layer is formed on the buffer layer 315. The impurity concentration in the buffer layer 315 is higher than that in the N-type epitaxial semiconductor layer formed on the buffer layer 315. An N-type drain region (N$^-$-type drain region) 36, a P-type base region 35, and an N-type source region (N$^-$-type source region) 34 are formed in the N-type epitaxial semiconductor layer positioned on the buffer layer 315. The P-type base region 35 is formed in a surface region of the N$^-$-type drain region 36. The N-type source region 34 is formed in a surface region of the P-type base region 35. Each of these P-type base region 35 and N-type source region 34 is formed by impurity diffusion. Also formed is a trench gate extending from the surface of the N-type source region 34 to reach the N-type drain region 36. A gate insulating film 37 consisting of, for example, a silicon oxide film is formed on the side wall and the bottom of the trench gate. Also, a gate electrode 38 made of, for example, polysilicon is buried in the gate trench. The gate insulating film 37 and the gate electrode 38 are covered with an interlayer insulating film 33 such as a silicon oxide film. Further, a source electrode 31 consisting of a metal electrode such as an aluminum electrode is formed on the source region 34 and the base region 35 with a barrier metal layer 32 interposed therebetween so as to be electrically connected to the source region 34 and the base region 35. Still further, a drain electrode 312, which is a metal electrode, is formed on a second main surface (back surface) of the semiconductor substrate 311.

A P-type contact region (P$^+$-type contact region) 314 consisting of an impurity diffusion region of a high impurity concentration is formed in a surface region of the P-type base region 35. Also formed is a contact trench extending downward from the surface of the P-type base region 35 through the P-type contact region 14 and the P-type base region 5 to reach an inner region of the N-type drain region 36. Further, a P-type impurity diffusion region (P$^-$-type impurity diffusion region) 39 having an impurity concentration lower than that in the P-type base region 35 is formed on the side wall and the bottom of that portion of the contact trench which is positioned within the N-type drain region 36. A conductive film 30 made of, for example, polysilicon is buried in the contact trench.

It is possible to form an oxide film such as a silicon oxide film on the side wall and bottom within the contact trench and to bury a conductive film such as a polysilicon film or an amorphous silicon film within the trench surrounded by the oxide film.

In this embodiment, a conductive film of polysilicon is buried in each of the gate trench and the contact trench. However, the conductive film buried in the trench is not limited to the polysilicon film. It is also possible to bury in the trench another conductive material such as amorphous silicon or SIPOS (amorphous SiO), or an insulating film such as a CVD silicon oxide film.

Further, it is possible to form an oxide film such as a silicon oxide film on the side wall and the bottom of the contact trench and to bury a conductive film such as a polysilicon film or an amorphous silicon film within the trench surrounded by the oxide film.

Also, in the IGBT according to this embodiment, the impurity diffusion layer 39 of a low impurity concentration, which is formed in the periphery of the side wall of the contact trench, causes the depletion layer to grow in a direction perpendicular to the gate trench during application of the reverse bias, with the result that the electric field concentration on the corner portion of the gate trench is relaxed so as to improve the breakdown voltage. By this technology, the breakdown voltage fully comparable with that in the prior art can be obtained even if the impurity concentration is increased in the epitaxial growth layer of silicon, making it possible to lower the resistance of the epitaxial layer, compared with the prior art. It should also be noted that, since a deep extended base region is partially formed in the P-type base region because of the formation of the contact trench, a low resistivity layer of hole is formed. Since the formation of the low resistivity layer facilitates the flow of the hole current in the step of the switching off, the switching time can be shortened.

Figure 6:
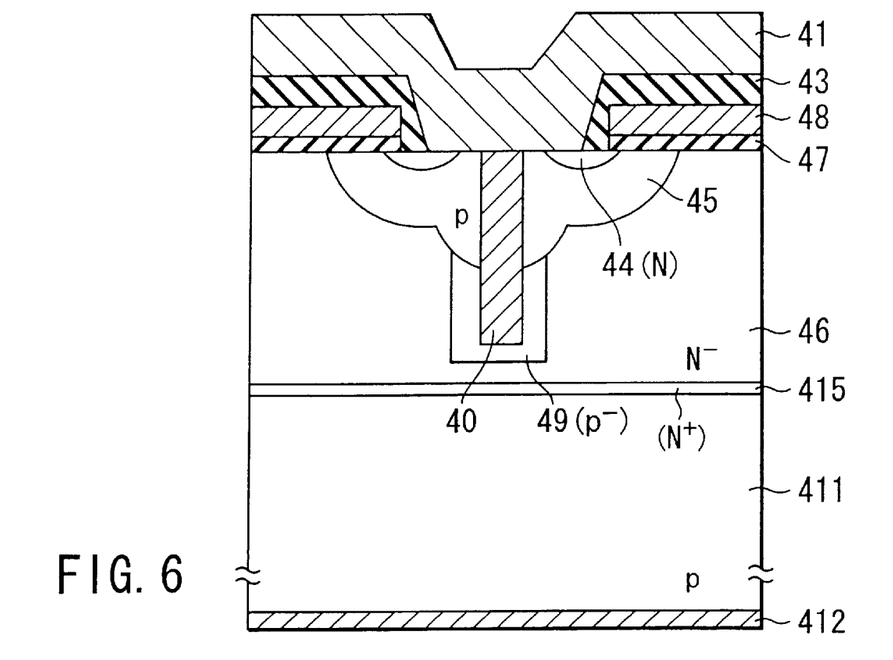
FIG. 6 is a cross sectional view showing a power MOSFET of a planar structure according to a fourth embodiment of the present invention.

FIG. 6 shows a power MOSFET of a planar structure according to a fourth embodiment of the present invention. In other words, FIG. 6 shows a unit cell portion of a semiconductor device.

A buffer layer 415 consisting of an N$^+$-type epitaxial silicon semiconductor layer is formed on a first main surface (upper surface) of a P-type silicon semiconductor substrate 411, and an N-type epitaxial semiconductor layer (N$^-$-type drain region) 46 is formed on the buffer layer 415. The impurity concentration in the buffer layer 415 is higher than that in the N-type epitaxial semiconductor layer 46 formed on the buffer layer 415. A P-type base region 45 is formed in a surface region of the N-type drain region 46. Also, an N-type source region 44 is formed in a surface region of the P-type base region 45. A gate insulating film 47 such as a silicon oxide film is formed on the N-type source region 44, the P-type base region 45 and the N-type drain region 46 except the region where a source electrode is to be formed. Also, a gate electrode 48 consisting of, for example, polysilicon is formed on the gate insulating film 47. These gate insulating film 47 and gate electrode 48 are covered with an interlayer insulating film 43 such as a silicon oxide film. A source electrode 41 consisting of a metal electrode such as an aluminum electrode is formed on the N-type source region 44 and the P-type base region 45 so as to be electrically connected to the N-type source region 44 and the P-type base region 45. Further, a drain electrode 412 is formed on a second main surface (back surface) of the semiconductor substrate 411.

Further, formed is a contact trench extending from the surface of the base region 45 through the base region 45 to reach an inner region of the N-type drain region 46. Still further, a P-type impurity diffusion region (P$^-$-type diffusion region) 49 having an impurity concentration lower than that in the P-type base region 45 is formed in the side wall and the bottom of that portion of the contact trench which is positioned within the N-type drain region 46. A conductive film 40 such as a polysilicon film is buried in the contact trench.

In this embodiment, a conductive film of polysilicon is buried in the contact trench. However, the conductive film buried in the trench is not limited to the polysilicon film. It is also possible to bury in the trench another conductive material such as amorphous silicon or SIPOS (amorphous SiO), or an insulating film such as a CVD silicon oxide film.

Further, it is possible to form an oxide film such as a silicon oxide film on the side wall and the bottom of the contact trench and to bury a conductive film such as a polysilicon film or an amorphous silicon film within the trench having the oxide film formed therein.

Also in this embodiment, an electric field is dispersed in the extended portion of the P-type base region 45. To be more specific, since the P-type impurity diffusion layer 49 having a low impurity concentration, which is formed in the periphery of the side wall of the contact trench, causes the depletion layer to grow in a direction perpendicular to the gate trench during application of the reverse bias, the electric field concentration on the extended portion of the P-type base region 45 is relaxed so as to improve the breakdown voltage. By this technology, the breakdown voltage fully comparable with that in the prior art can be obtained even if the impurity concentration is increased in the epitaxial growth layer of silicon, making it possible to lower the resistance of the epitaxial layer, compared with the prior art. It should also be noted that, since a deep extended base region is partially formed in the P-type base region 45 because of the formation of the contact trench, a low resistivity layer of hole is formed. Since the formation of the low resistivity layer facilitates the flow of the hole current in the step of the switching off, the switching time can be shortened.

To reiterate, in the present invention, the impurity diffusion layer of a low impurity concentration, which is formed in the periphery of the side wall of the contact trench, causes the depletion layer to grow in a direction perpendicular to the gate trench during application of the reverse bias, with the result that the electric field concentration on the corner portion of the gate trench or on the extended portion of the base region is relaxed so as to improve the breakdown voltage. By this technology, the breakdown voltage fully comparable with that in the prior art can be obtained even if the impurity concentration is increased in the epitaxial growth layer of silicon, making it possible to lower the resistance of the epitaxial layer, compared with the prior art. It should also be noted that, since a deep extended base region is partially formed in the P-type base region, a low resistivity layer of hole is formed. Since the formation of the low resistivity layer facilitates the flow of the hole current in the step of the switching off, the switching time can be shortened.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:

a semiconductor substrate;

a semiconductor layer of a first conductivity type formed on one main surface region of said semiconductor substrate;

a drain region of the first conductivity type formed in said semiconductor layer of the first conductivity type;

a base region of a second conductivity type formed in a surface region of said drain region;

a source region of the first conductivity type formed in a surface region of said base region;

a trench having at least one of a conductive layer and an insulating layer buried therein and extending from the surface of the base region through the base region to reach an inner region of the drain region;

an impurity diffusion region of the second conductivity type formed in the periphery of the side wall of that portion of the trench which is positioned within the drain region and having an impurity concentration lower than that in the base region;

a gate insulating film formed to cover a part of the surfaces of the drain region, the base region and the source region; and a gate electrode formed on the gate insulating film.

2. The semiconductor device according to claim 1, wherein the semiconductor substrate is of the first conductivity type.

3. The semiconductor device according to claim 1, wherein the semiconductor substrate is of the second conductivity type.

4. A semiconductor device, comprising:

a semiconductor substrate;

a semiconductor layer of a first conductivity type formed on one main surface region of said semiconductor substrate;

a drain region of the first conductivity type formed in said semiconductor layer of the first conductivity type;

a base region of a second conductivity type formed in a surface region of said drain region;

a source region of the first conductivity type formed in a surface region of said base region;

a first trench having at least one of a conductive layer and an insulating layer buried therein and extending from the surface of the base region through the base region to reach an inner region of the drain region;

an impurity diffusion region of the second conductivity type formed in the periphery of the side wall of that portion of the first trench which is positioned within the drain region and having an impurity concentration lower than that in the base region;

a second trench extending from the surface of the source region or from the surface of that portion of the base region which is contiguous to the source region to reach an inner region of the drain region;

a gate insulating film formed in the side wall and the bottom region of said second trench; and a gate electrode buried in said second trench in a manner to cover said gate insulating film.

5. The semiconductor device according to claim 4, wherein the semiconductor substrate is of the first conductivity type.

6. The semiconductor device according to claim 4, wherein the semiconductor substrate is of the second conductivity type.

7. The semiconductor device according to claim 4, wherein the depth of the first trench from the surface of the base region is larger than that of the second trench from the surface of the source region or from the surface of that portion of the base region which is contiguous to the source region.

8. The semiconductor device according to claim 7, wherein the semiconductor substrate is of the first conductivity type.

9. The semiconductor device according to claim 7, wherein the semiconductor substrate is of the second conductivity type.

10. The semiconductor device according to claim 9, wherein a buffer layer formed of a semiconductor layer of the first conductivity type having an impurity concentration higher than that in the semiconductor layer of the first conductivity type is formed between the semiconductor substrate and the semiconductor layer of the first conductivity type.

* * * * *